US005572145A

United States Patent [19]
Kinsella

[11] Patent Number: 5,572,145
[45] Date of Patent: Nov. 5, 1996

[54] METHOD FOR MINIMIZING GROUND BOUNCE IN DIGITAL CIRCUITS VIA TIME DOMAIN SHIFTS

[75] Inventor: Kevin R. Kinsella, San Diego, Calif.

[73] Assignees: Sony Corporation, Tokyo, Japan; Sony Electronics Inc., Park Ridge, N.J.

[21] Appl. No.: 523,923

[22] Filed: Sep. 6, 1995

[51] Int. Cl.$^6$ .................................................. H03K 17/16
[52] U.S. Cl. .............................. 326/26; 326/28; 326/86
[58] Field of Search ................................ 326/21, 26–28, 326/82, 86

[56] References Cited

U.S. PATENT DOCUMENTS

| 4,587,445 | 5/1986 | Kanuma | 326/28 |
| 4,857,765 | 8/1989 | Cahill et al. | 326/26 |
| 4,883,978 | 11/1989 | Ohshima et al. | 326/24 |
| 5,229,657 | 7/1993 | Rackley | 326/26 |
| 5,319,260 | 6/1994 | Wanlass | 326/21 X |
| 5,323,070 | 6/1994 | Ueda et al. | 326/21 X |

Primary Examiner—David R. Hudspeth
Attorney, Agent, or Firm—Ronald P. Kananen

[57] ABSTRACT

A switching array is formed with a plurality of switches each having an input and an output. The switches are associated with a digital bus, such as an address or data bus, and transfer the values on their inputs to their outputs when a control signal is received. When the switches undergo a transition from a logical value of "1," which is about the supply voltage down to a logical value of "0," which is about the ground potential, the switches produce a load current which is discharged to ground. In a first embodiment, the load current is divided into two parts and discharged to ground at two different times by using switches which have two different speeds. The faster switches will discharge the load current first followed a time later by the second slower group of switches. In a second embodiment, the switches all have the same speed and the control signal is delayed to half of the switches. Thus, the switches receiving a delayed control signal will discharge a load current later than the other switches. By dividing the load current into two halves and discharging the two load currents at different times, the ground plane is better able to absorb the load current.

19 Claims, 3 Drawing Sheets

METHOD FOR MINIMIZING GROUND BOUNCE IN DIGITAL CIRCUITS VIA TIME DOMAIN SHIFTS

BACKGROUND OF THE INVENTION

1. Field of the Invention

The invention generally relates to a switching array and method for reducing ground current in busses. More particularly, this invention relates to a switching array and method in which switches are used in digital circuits, such as address or data busses, and are switched at different times thereby reducing the ground current that must be absorbed by a ground plane at any given instant of time.

2. Description of the Prior Art

In the field of digital computer circuits, which includes memory caches, memory arrays, graphics systems, video systems, imaging systems, and the like, it is common practice to use high speed switching circuits in connection with address or data busses. For instance, with reference to FIG. 1, an array 1 of switches 10 is shown with each switch $10_i$ having its own input $12_i$ and its own output $14_i$. The array 1 may have any number of switches 10 but normally will have multiples of 8, such as 8, 16, 32, 64, 128, etc.

While the switches 10 have their unique input 12 and output 14, the switches 10 share a common control line 16. The switches 10 latch the outputs 14 to the values of the voltages on their inputs at the time when a control signal is received on the control line 16. The number of switches 10 in the array 1 corresponds to the number of bits in the address or data bus. Thus, for many applications where the address or data buss is rather large, such as 64 bits or larger, the array 1 will have a corresponding large number of switches 10.

The outputs 14 of the switches 10 are digital signals with a logical value of "1" being represented by a high voltage at or near the Vcc supply and a logical value of "0" being represented by a "low" voltage at or near ground potential. When the output 14 of a switch 10 undergoes a transition from low to high, namely from a "0" to a "1," a capacitance associated with the output 14 must be charged to the Vcc supply voltage. On the other hand, when the output 14 of a switch 10 undergoes a transition from high to low, which is from "1" to "0," the charge on the output 14 must be discharged to ground in order to reduce the voltage from the "high" voltage to the "low" voltage.

The transition from a "1" to a "0" in a plurality of the switches 10 may produce problems in other circuitry. For example, a 64 bit array 1 of switches 10 may be associated with a graphics controller for displaying images on a computer monitor. When the image on the monitor changes from all black to all white, all of the outputs 14 of the switches 10 will change from high to low. Consequently, since all of the switches 10 discharge simultaneously, a maximum amount of current flows to ground and must be absorbed by a ground plane. As known to those skilled in the art, the current flowing to ground plane often increases the ground voltage due to the di/dt and IR effects. The increase in ground voltage, in turn, can alter the logic in other circuitry in the general vicinity, thereby resulting in a malfunction, "glitch," lock-up, or crash in the other circuitry. The problems in other circuitry may occur when less than all of the switches 10 undergo a transition from "1" to "0," such as with just a majority or substantial number of the switches 10.

Thus, it can be understood that when all or a significant plurality of the switches 10 in an array 1 are switched from high to low at the same time, the ground plane may be unable to absorb all of the current, thereby causing the difficulties generally discussed above.

Integrated chip (IC) manufacturers have addressed these problems by having "controlled edge rate" switching in the switches. The "controlled edge rate" switching reduces the inductive effects of the "di/dt" curve, which is the rate of change of current per unit time, and therefore reduces the amount of current flowing to the ground plane. While "controlled edge rate" switching has, to some extent, alleviated the above-mentioned problem, the problem has often become more aggravated since circuit designers are encouraged to use even more switches in an array.

Thus, it continues to be a problem in the art, especially as bit transfer rates increase and the size of busses increase, to address and overcome the problems raised when a significant number or all of the switches in an array simultaneously undergo a transition from high to low.

BRIEF SUMMARY OF THE INVENTION

It is an object of the invention to reduce the amount of current that must be absorbed by a ground plane at any given instant of time.

It is another object of the invention to eliminate or at least reduce increases in ground voltage.

It is another object of the invention to reduce malfunctions in circuitry associated with switching arrays.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects, in accordance with the present invention, as embodied and broadly described herein, a switching array for use with digital busses has a plurality of switches with each switch having an input and an output and producing either a high or low voltage on the output based upon the voltage on the input at the time when a control signal is received. When the outputs of the switches undergo a transition from high to low, a load current is produced and is discharged to ground. The switching array has a first group of switches which produces an output at a first period of time following the control signal and has a second group of switches which produces an output at a second period of time following the control signal. The first period of time is shorter than the second period of time so that the load current from the first group of switches is discharged to ground before the load current from the second group of switches. Because the load current has been divided into two smaller currents, the ground plane is better able to absorb the current without causing malfunctions in adjacent circuitry.

In one embodiment, the switches forming the array have different switching speeds. The faster switches form the first group and discharge the load current before the slower switches in the second group. In another embodiment, the switches in the array all have the same switching speed but the switches in the second group receive a delayed control signal. As a result, the second group will discharge the load current later than the first group of switches.

In a method according to the invention, the control signal is routed to an array of switches with each switch having an input and an output. A first group of switches generates their outputs and discharges a first load current followed by a second group of switches which generates their outputs and discharges a second load current. By separating the time at which the load currents from the two groups of switches are discharged to ground, the ground plane is better able to absorb the load currents.

These and other features of this invention will become apparent from a detailed review of this specification, taken in conjunction with the accompanying drawings and the written description.

BRIEF DESCRIPTION OF THE DRAWINGS

The accompanying drawings, which are incorporated in, and form a part of, the specification, illustrate embodiments of the present invention and, together with the description, serve to explain the principles of the invention.

In the drawings.

DETAILED DESCRIPTION OF THE PREFERRED EMBODIMENTS

Reference will now be made in detail to the preferred embodiments of the invention, examples of which are illustrated in the accompanying drawings.

Figure 1:
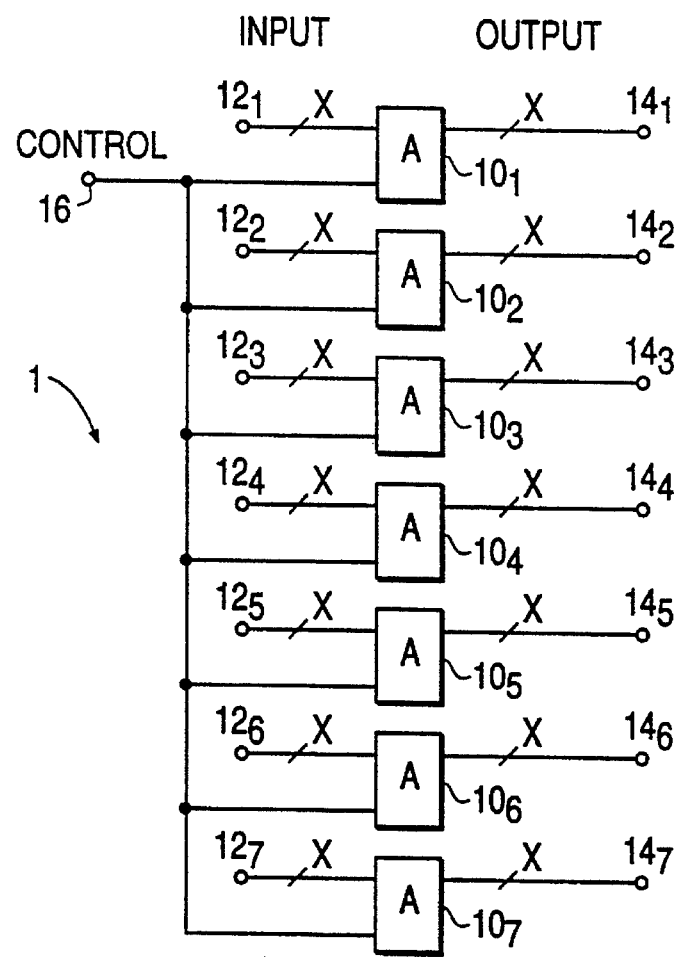
FIG. 1 is a schematic diagram of a conventional switching array.
Figure 2:
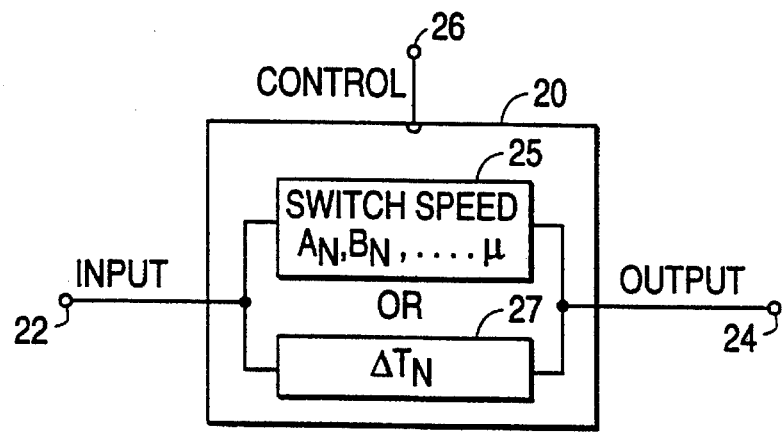
FIG. 2 is a block diagram illustrating alternative concepts for implementing the invention.

FIG. 2 illustrates conceptually two alternative approaches to reduce the amount of ground current. A switch 20 has an input line 22, output line 24, and a control line 26 and operates in a manner similar to the switches 10 of FIG. 1 in that the signal on input line 22 is latched on the output line 24 upon receipt of a control signal on the control line 26. With one approach of the invention, however, the switch 20 may operate at varying speeds, as generally depicted by switching speed block 25. Alternatively, the switch 20 may be subjected to a time delay, as depicted by time delay block 27. These two approaches in reducing ground current will be discussed in more detail below.

Figure 3:
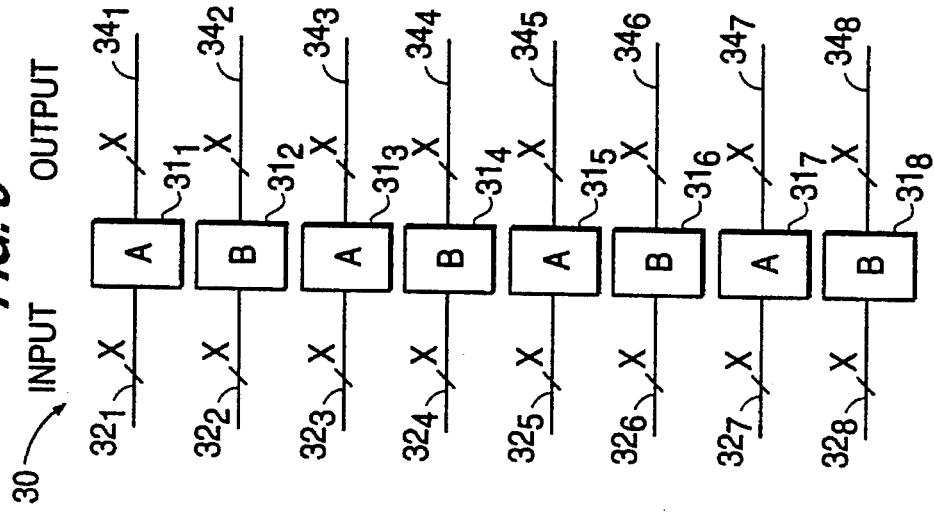
FIG. 3 is a switching array according to a first embodiment of the invention.

With reference to FIG. 3, a plurality of switches 31 are arranged in an array 30 with each switch $31_i$ having a respective input $32_i$ and output $34_i$. Although not shown, the switches 31 also share a common control line for latching the outputs 34 of the switches 31. As denoted by letters A and B, the switches 31 are comprised of two different types of switches 31 with the two types A and B having different switching speeds. For example, the first type A of switch 31 is capable of switching and sinking its current to the ground plane at a speed of 7 ns and the second type B of switch 31 is slower and is only capable of switching and sinking its current at a speed of 10 ns.

Because of the different switching speeds, when the control signal is applied to all of the switches 31, the switches 31 of type A will switch first followed a time later by the switches 31 of type B. More precisely, for the given speeds of the switches 31, the switches 31 of type A will sink their current 7 ns after the control signal while the switches 31 of type B will sink their current 10 ns after the control signal. The current load for the switching array 30 has therefore been divided in half with the two smaller currents being separated in time by 3 ns. Consequently, the ground plane is better able to absorb all of the current from the switching array 30, even if all of the switches 31 in the array 30 undergo a transition from high to low.

Preferably, the switches 31 of the two types A and B are physically placed on a circuit board in a staggered or alternative fashion. Also, it should be understood that the switches 31 may be divided into more than two types. For instance, while a 64 bit bus may have switches of only two speeds, a larger bus may require switches of three or more speeds commonly controlled by the same control signal.

Figure 4:
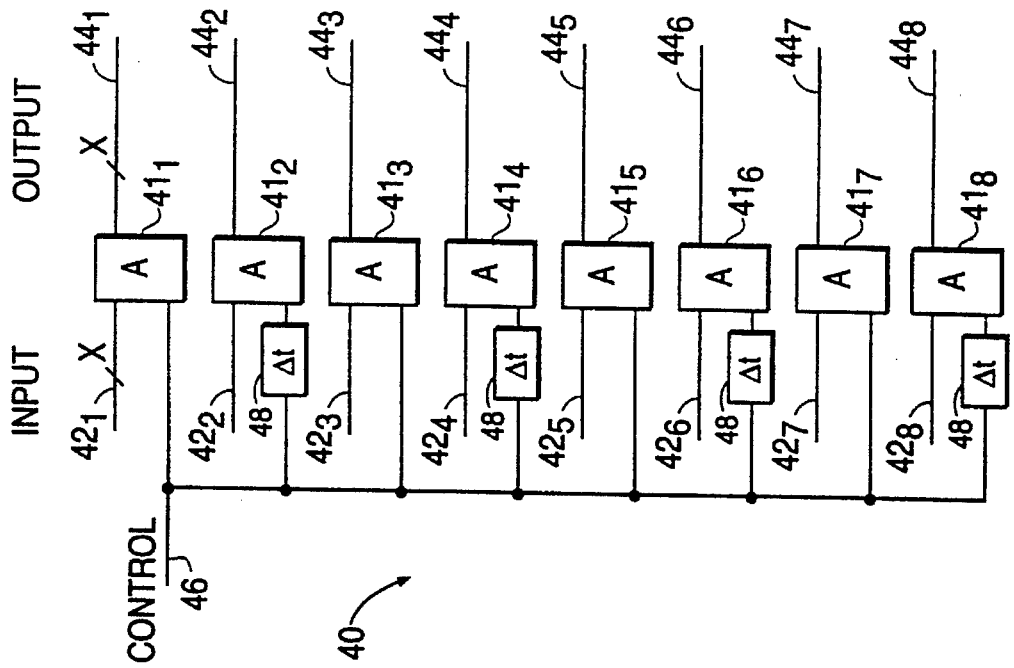
FIG. 4 is a switching array according to a second embodiment of the invention.

A switching array 40 according to a second embodiment of the invention, as shown in FIG. 4, comprises a plurality of switches 41 with each switch $41_i$ each having its own input $42_i$ and output $44_i$. As denoted by the letter A, the switches 41 forming the array 40 all have the approximately same switching speed, such as 7 ns. The switches 41 also receive the same control signal on control line 46. The control signal, however, passes through a delay circuit 48 for every other switch 41. Thus, if the delay circuit is equal to 3 ns, half of the switches 41 will sink their current at 7 ns and the other half of the switches 41, which is the half associated with delay circuits 48, will sink their current 3 ns later at 10 ns. The switching array 40 therefore divides the ground current in half and sinks each half to the ground plane at different time periods.

As will be apparent to those skilled in the art, the switching array 40 according to the second embodiment may employ multiple time periods in order to divide the ground current into more than two parts. For instance, a 512 bit bus may have the load current divided into four parts with each portion of the load current being absorbed by the ground plane in a staggered relationship.

Figure 5:
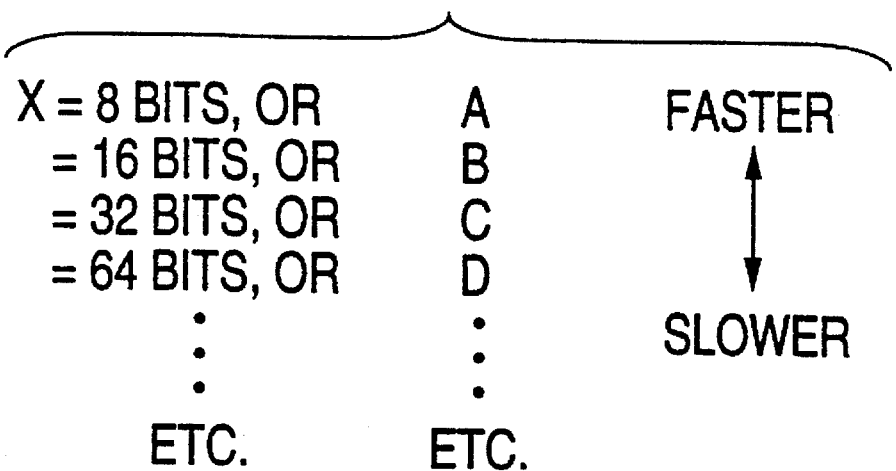
FIG. 5 is a switch width and speed grade table.

The invention is not limited to a single switching array but may be implemented on a larger level. With reference to FIG. 5, the invention may be adopted on a board level wherein switches A and B are used for 16 busses, and so forth with switches A having a faster switching speed than the later letters, such as switch D having a lower speed.

Figure 6:
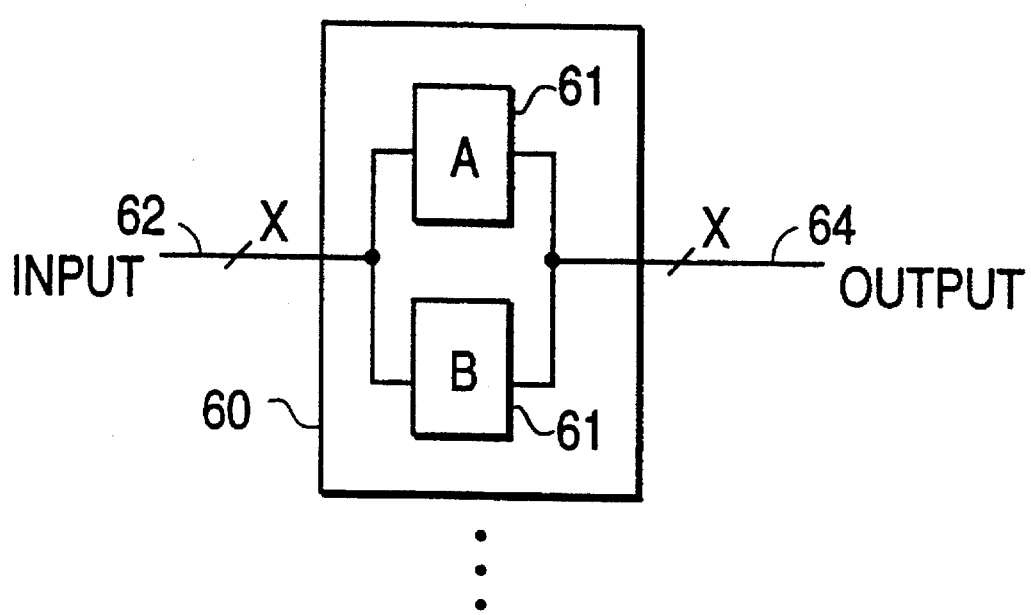
FIG. 6 is an integrated circuit incorporating the principles of the invention.

The invention may also be implemented on a smaller level than that shown in FIGS. 3 to 5. For instance, with reference to FIG. 6, an integrated circuit 60 may have an array of switches 61 with an input 62 and an output 64. While only one input 62 and one output 64 have been illustrated, it should be understood that each switch 61 in the circuit 60 has its own input 62 and its own output 64. The switches 61 formed within the integrated circuit 60 are designed to have different switching speeds. The switches 61 of type A, as with the embodiment of FIG. 3, may have a switching speed of 7 ns while the switches 61 of type B may have a switching speed of 10 ns. The switches 61 of type A will therefore latch their output at a faster speed and will, consequently, sink their current before the switches 61 of type B.

The invention can be implemented with greater or lesser switching speed differentials between the switches A and switches B, so long as a discrete differential between the switching times is maintained, and overlap between the times is avoided. The invention may also be implemented with switches having different switching switches in combination with one or more types of delay circuits. Moreover, a greater number of switching groups can be selected, for example, according to the assignment chart of FIG. 5.

The foregoing embodiments are considered to be the preferred embodiments of the invention, recognizing that there are many alternative forms of construction of and implementation for the invention. It will thus be clear to those skilled in the art that the various changes and modification may be made therein without departing from the invention. It is therefore intended that the appended claims cover such change and modification as may fall within the spirit and scope of the invention.

What is claimed is:

1. A switching array for use with digital busses in which a first logical value is represented by a first voltage and a second logical value is represented by a second voltage, comprising:

a plurality of switches with each switch having an input and an output, each switch producing said first voltage on said output when said first voltage is on said input upon receipt of a control signal, and each switch producing said second voltage on said output when said second voltage is on said input upon receipt of said control signal;

said switches producing a load current which is discharged to ground when outputs of said switches undergo a transition from said first voltage to said second voltage;

a first group of said plurality of switches generating said first voltage or said second voltage on said output at a first period of time following said control signal; and a second group of said plurality of switches generating said first voltage or said second voltage on said output at a second period of time following said control signal;

wherein said first period of time is shorter than said second period of time so that said load current from said first group of switches is discharged to ground before said load current from said second group of switches and wherein said first group of switches has a first switching speed and said second group of switches has a second switching speed with said first switching speed being faster than said second switching speed.

2. The switching array as set forth in claim 1, wherein said first switching speed is 7 nanoseconds and said second switching speed is 10 nanoseconds.

3. The switching array as set forth in claim 1, further comprising a delay circuit associated with each of the switches in said second group.

4. The switching array as set forth in claim 1, wherein a third group of switches generate said first voltage or said second voltage on said output at a third period of time following said control signal, said third period of time being longer than either said first or second periods of time.

5. The switching array as set forth in claim 1, wherein said first group of switches and said second group of switches are both located on a single integrated circuit.

6. The switching array as set forth in claim 1, wherein each of said switches is formed inside a separate integrated circuit.

7. The switching array as set forth in claim 1, wherein said first group of switches is located on a first printed circuit board and said second group of circuits is located on a second printed circuit board.

8. A switching array for use with digital busses in which a first logical value is represented by a first voltage and a second logical value is represented by a second voltage, comprising:

a plurality of switches with each switch having an input and an output, each switch producing said first voltage on said output when said first voltage is on said input upon receipt of a control signal, and each switch producing said second voltage on said output when said second voltage is on said input upon receipt of said control signal;

said switches producing a load current which is discharged to ground when outputs of said switches undergo a transition from said first voltage to said second voltage;

a first group of said plurality of switches generating said first voltage or said second voltage on said output at a first period of time following said control signal; and a second group of said plurality of switches generating said first voltage or said second voltage on said output at a second period of time following said control signal;

wherein said first period of time is shorter than said second period of time so that said load current from said first group of switches is discharged to ground before said load current from said second group of switches and wherein locations of said first group of switches alternate with locations of said second group of switches in said array.

9. The switching array as set forth in claim 8, wherein said switches of said first group have a switching speed equal to a switching speed of said second group of switches.

10. The switching array as set forth in claim 8, wherein said first group of switches and said second group of switches are both located on a single integrated circuit.

11. The switching array as set forth in claim 8, wherein each of said switches is formed on a separate integrated circuit.

12. The switching array as set forth in claim 8, wherein said first group of switches is located on a first printed circuit board and said second group of circuits is located on a second printed circuit board.

13. A method for reducing ground bounce in a digital bus in which a first logical value is represented by a first voltage and a second logical value is represented by a second voltage, comprising the steps of:

routing a control signal to an array of switches with each switch having an input and an output;

for each switch in a first group of said switches having a first switching speed, generating said first voltage on said output when said first voltage is on said input upon receipt of said control signal and generating said second voltage on said output when said second voltage is on said input upon receipt of said control signal;

discharging to ground a first load current produced by said switches in said first group which undergo a transition from said first voltage to said second voltage;

for each switch in a second group of said switches having a second switching speed, generating said first voltage on said output when said first voltage is on said input upon receipt of said control signal and generating said second voltage on said output when said second voltage is on said input upon receipt of said control signal; and discharging to ground a second load current produced by said switches in said second group which undergo a transition from said first voltage to said second voltage;

wherein said first switching speed for said first group of switches is different than said second switching speed for said second group of switches and, as a result, said step of discharging said first load current occurs a period of time before said step of discharging said second load current.

14. The method as set forth in claim 13, further comprising the step of delaying said control signal by said period of time for each switch in said second group of switches.

15. The method as set forth in claim 13, further comprising the steps of:

for each switch in a third group of said switches, generating said first voltage on said output when said first voltage is on said input upon receipt of said control signal and generating said second voltage on said output when said second voltage is on said input upon receipt of said control signal; and discharging to ground a third load current produced by said switches in said third group which undergo a transition from said first voltage to said second voltage;

wherein said step of discharging said third load current occurs after said step of discharging said first load current and said step of discharging said second load current.

16. A method for reducing ground bounce in a digital bus in which a first logical value is represented by a first voltage and a second logical value is represented by a second voltage, comprising the steps of:

routing a control signal to an array of switches with each switch having an input and an output;

dividing said array of switches into at least a first group and a second group and alternating the locations of said first group of said switches with said second group of switches in said array;

for each switch in a first group of said switches, generating said first voltage on said output when said first voltage is on said input upon receipt of said control signal and generating said second voltage on said output when said second voltage is on said input upon receipt of said control signal;

discharging to ground a first load current produced by switches in said first group which undergo a transition from said first voltage to said second voltage;

for each switch in a second group of said switches, generating said first voltage on said output when said first voltage is on said input upon receipt of said control signal and generating said second voltage on said output when said second voltage is on said input upon receipt of said control signal; and discharging to ground a second load current produced by said switches in said second group which undergo a transition from said first voltage to said second voltage;

wherein said step of discharging said first load current occurs a period of time before said step of discharging said second load current.

17. The method as set forth in claim 16, wherein said step of alternating comprises the step of alternating said first and second groups of switches within a single integrated circuit.

18. The method as set forth in claim 16, wherein said step of alternating comprises the step of locating said first group of switches on a first integrated circuit and locating said second group of switches on a second integrated circuit.

19. The method as set forth in claim 16, wherein said step of alternating comprises the step of locating said first group of switches on a first printed circuit board and locating said second group of switches on a second printed circuit board.

* * * * *